United States Patent [19]

Brown

[11] Patent Number: 5,150,438

[45] Date of Patent: Sep. 22, 1992

[54] OPTOCOUPLER APPARATUS WITH REFLECTIVE OVERCOAT

[75] Inventor: Clem H. Brown, Scottsdale, Ariz.

[73] Assignee: Motorola, Inc., Schaumburg, Ill.

[21] Appl. No.: 737,291

[22] Filed: Jul. 29, 1991

[51] Int. Cl.[5] .............................................. G02B 6/12
[52] U.S. Cl. ........................................ 385/14; 385/39
[58] Field of Search ...................... 385/14, 47, 39, 51

[56] References Cited

U.S. PATENT DOCUMENTS

| | | | |
|---|---|---|---|
| 4,218,260 | 8/1980 | Metzler | 106/98 |
| 4,244,492 | 1/1981 | Beyerstedt et al. | 220/453 |
| 4,272,594 | 6/1981 | George et al. | 430/14 |
| 4,472,020 | 9/1984 | Evanchuk | 385/47 |
| 4,870,279 | 9/1989 | Cueman et al. | 250/368 |
| 4,901,329 | 2/1990 | Leas | 385/14 |

Primary Examiner—John D. Lee
Assistant Examiner—John Ngo
Attorney, Agent, or Firm—Joe E. Barbee

[57] ABSTRACT

A technique for encapsulating an optocoupler apparatus to improve light coupling efficiency, reliability and cost. An optocoupler apparatus comprises a light emitting device (10) and a light detecting device (11) mounted to conductors (12A,12B). A light coupling material (14) surrounds the optocoupler apparatus. The light coupling material (14) is an electrical dielectric which is transparent to light. A portion of the light coupling material (14) is coated with a light reflective material (16). The light reflective material (16) is a mixture of the light coupling material (14) and titanium dioxide. The benefit of coating the light coupling material (14) with the light reflective material (16) is the two materials have similar chemical properties, and the reflective property of the light reflective material (16) arises from the titanium dioxide; the second most reflective material available. An encapsulating material (17 or 19) further envelops the encased optocoupler apparatus.

12 Claims, 2 Drawing Sheets

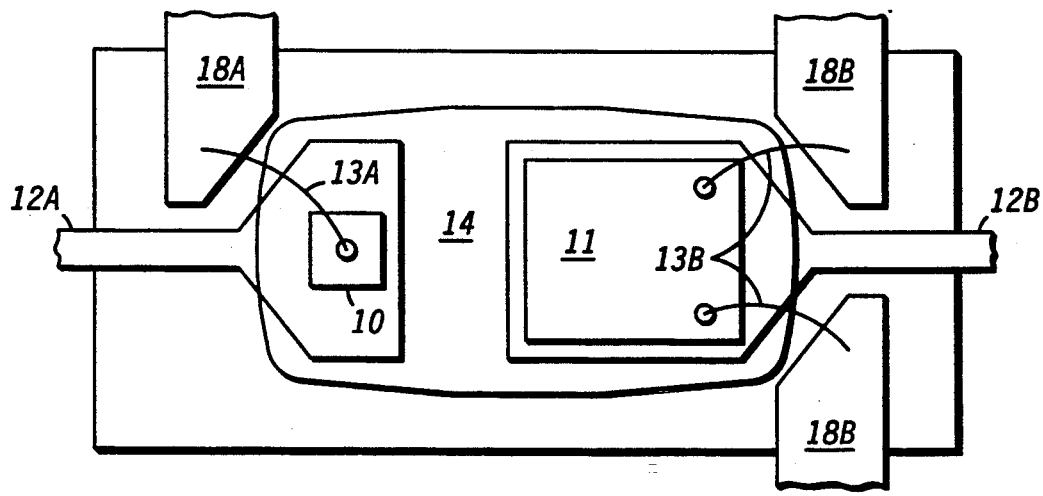
FIG. 1
FIG. 2
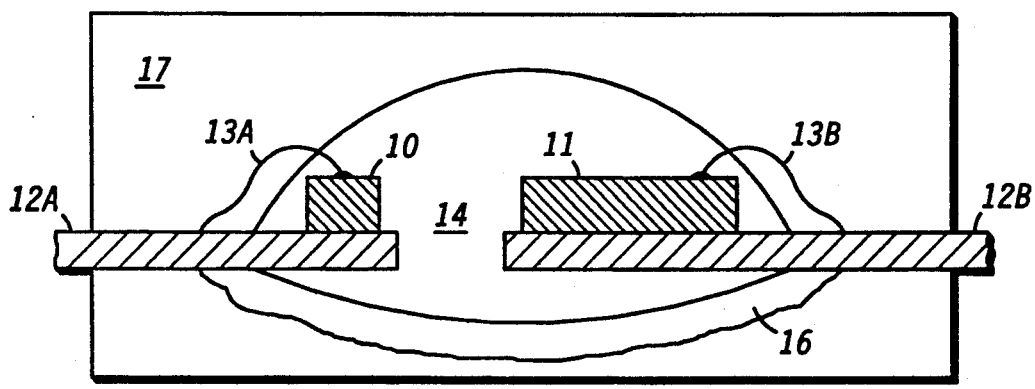

OPTOCOUPLER APPARATUS WITH REFLECTIVE OVERCOAT

BACKGROUND OF THE INVENTION

This invention relates, in general, to an optocoupling apparatus, and more particularly to a method for encasing an optocoupling apparatus.

Optocouplers (also referred to as optical couplers or optoisolators) have been used for electrical isolation in systems such as computers, power supplies, telecommunications, and controllers. Typically, optocouplers have comprised a light emitting diode electrically connected to one or more electrodes, and a light sensing diode connected to one or more additional electrodes.

The light emitting diode, the light sensing diode, and portions of the electrodes have been enclosed within a light coupling material. Further, the light coupling material and portions of the electrodes have been encased within an encapsulating material. The light coupling material typically has been a clear silicone gel that allows light to pass freely from the light emitting diode to the light sensing diode while maintaining electrical isolation between the electrodes.

What is more, the encapsulating material typically has been an opaque epoxy that reflects light from the light emitting diode back into the clear gel. A second function of the encapsulating material has been to prevent light originating from external sources, from reaching the clear gel. Further, the encapsulating material has served as a protective enclosure from external mechanical forces.

Although methods for encasing optocoupling devices have been developed, several inherent limitations do exist. One of the foremost problems with available encasing techniques has been the presence of a creepage path along the boundary surface between the light coupling material and the encapsulating material. This path introduces an electrical breakdown region between the two materials.

The breakdown phenomenon is further exacerbated by the difference in the coefficients of thermal expansion between the light coupling material and the encapsulating material. Typically, the coefficient of thermal expansion of the light coupling material is many times greater than that of the encapsulating material. During the cooling phase after encapsulation, the light coupling material will contract more than the encapsulating material, causing gaps to form at the interface between the two materials. These gaps comprise gas or air and have a lower dielectric strength than the light coupling material and the encapsulating material. Over time, moisture condenses along the electrodes to the boundary between the two materials and into the gaps, thereby significantly increasing the likelihood of electrical breakdown.

A method for increasing the breakdown voltage along the boundary surface was disclosed by Adams, et. al. in U.S. Pat. No. 4,645,551, which is hereby incorporated herein by reference. In this patent, Adams et. al. presented a method for improving the bonding between the light coupling material and the encapsulating material by irradiating the light coupling material with ultraviolet light. This process activates the light coupling material thereby promoting formation of covalent bonds between the light coupling material and the encapsulating material. Since the two materials are linked covalently creepage paths are eliminated, preventing voltage breakdown between electrodes along the interface of the two materials.

A further reliability issue brought about by unmatched coefficients of thermal expansion is the failure of interconnect electrodes. Typically, an interconnect electrode connects the emitter device with a portion of the leadframe and the detector device with a different portion of the leadframe. Moreover, a portion of these interconnect electrodes is encased within the light coupling material, and the remaining portion is surrounded by the encapsulating material. Again, the coefficients of thermal expansion between the light coupling and encapsulating materials have been different. Since the interconnect electrodes are in materials with different coefficients of thermal expansion, temperature cycling may cause stress or bond failures of the interconnect electrodes. Finally, the cost of encasing an optocoupler apparatus is a strong function of the material used in the encapsulation process. Since the encapsulating material surrounds the light coupling material, the encapsulating material must be capable of reflecting light. In addition the encapsulant has been used as a protective enclosure from mechanical forces. The cost of material with light reflective properties and mechanical strength is high. In addition, materials commonly used to promote light reflectivity are very destructive to mold assemblies. Accordingly, it would be beneficial to have a method for encasing an optocoupling apparatus that minimizes the costs of the materials, while improving upon boundary surface breakdown and failure due to thermal and mechanical stresses.

SUMMARY OF THE INVENTION

Briefly stated, the present invention is an optocoupler assembly having a light reflective material applied over a light coupling material in one of three coverage schemes: cover only a portion of the light coupling material; cover a portion of the light coupling material and a portion of the electrical interconnects; or completely cover both the light coupling material and the electrical interconnects. Further, the light emitting device-detector device assembly including the electrical interconnects and a portion of each electrode are encased within an encapsulating material.

BRIEF DESCRIPTION OF THE DRAWINGS

FIG. 1 is a top view of an embodiment of the present invention;

FIG. 2 is a cross-sectional side view of the embodiment shown in FIG. 1;

DETAILED DESCRIPTION OF THE DRAWINGS

Figure 3:
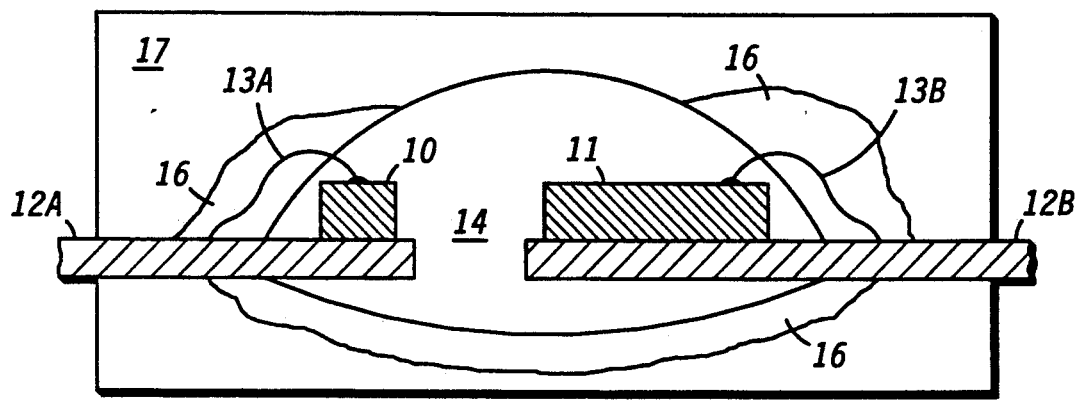
FIG. 3 is a cross-sectional side view showing another embodiment of the present invention.

Optocoupler devices provide isolation by electrically separating the transmitting and receiving elements of a signal transmission system, and using light to couple signals from a transmitting device to a receiving or detector device. Three parameters manufacturers of optocoupler devices strive to optimize are reliability, efficiency of light detection by a light detector, and cost.

A top view of an optocoupler apparatus surrounded by a light coupling material 14 is shown in FIG. 1. A light emitting device 10 is mounted to a first conductor 12A. A light detector device 11 is mounted to a second conductor 12B. First and second conductors 12A and 12B respectively, are spaced apart and preferably are coplanar. In a preferred embodiment, light emitting device 10 is a light emitting diode. Furthermore, light coupling material 14 is electrically non-conductive and transparent to radiation in both the visible and nonvisible spectra; in a preferred embodiment, light coupling material 14 is a clear silicone die coat sold by Dow Corning as X3-6633.

Typically, light emitting device 10 is mounted such that maximum light emission occurs through the sides of emitting device 10. Detector device 11, on the other hand, detects light impinging on its top surface. Hence efficiency of light detection will be increased by reflecting light onto the top surface of detector device 11.

Spaced from and adjacent to first conductor 12A is a third conductor 18A. Third conductor 18A is connected to light emitting device 10 by a first conductive interconnect 13A. Electrical signals are transmitted from third conductor 18A through first conductive interconnect 13A into light emitting device 10.

In addition, spaced from and adjacent to second conductor 12B is a fourth conductor 18B. Detector device 11 is electrically connected to fourth conductor 18B by a second conductive interconnect 13B. Fourth conductor 18B and second conductive interconnect 13B may be single conductors or, as shown in FIG. 1, a plurality of conductors. Electrical signals travel from detector device 11 through second conductive interconnect 13B into fourth conductor 18B. Light coupling material 14 surrounds light emitting device 10, light detector device 11, portions of first and second conductors 12A and 12B, respectively, and portions of first and second conductive interconnects 13A and 13B, respectively.

A cross-sectional side view of an embodiment of the structure illustrated in FIG. 1 is shown in FIG. 2. The structure shown in FIG. 2 possesses all the features of the structure illustrated in FIG. 1, and further includes an encapsulating material 17. In addition, the cross-sectional side view of FIG. 1 shows a light reflective material 16 coating a portion of light coupling material 14 surrounding the bottom side of first and second conductive supports 12A and 12B, respectively. Preferably, light reflective material 16 is a mixture of light coupling material 14 and 10% titanium dioxide ($TiO_2$) by weight. In other words, light reflective material 16 is a mixture of 90% clear silicone die coat X3-6633 and 10% $TiO_2$.

Encapsulating material 17 encases light coupling material 14, light reflective material 16, and portions of the following: first conductive support 12A, second conductive support 12B, first interconnect 13A, and second interconnect 13B. Although a light reflective material 16 is present on a portion of light coupling material 14, the areas of light coupling material 14 left uncoated will not reflect significant levels of light toward detector device 11. Preferably, encapsulating material 17 is capable of reflecting light since it surrounds light coupling material 14; otherwise, light reaching the interface between light coupling material 14 and encapsulating material 17 would continue to travel through encapsulating material 17 rather than being reflected toward detector device 11. Hence, encapsulating material 17 fulfills a light reflection function in addition to protecting the optocoupler apparatus from mechanical stresses. In a preferred embodiment, encapsulating material 17 is a white, opaque mold compound formed by mixing 70% epoxy, by weight, and 30% titanium dioxide, by weight, and sold by ICI Fiberite as ICI Fiberite 8436 FR.

The configuration shown in FIG. 2 serves to improve the breakdown voltage of an encased optocoupling apparatus. Breakdown voltage is a function of the length of the material interface that runs between first conductor 12A and second conductor 12B, commonly referred to as the creepage path; the longer the creepage path the higher the breakdown voltage. The critical creepage path, defined as the path along which breakdown voltage is lowest, occurs along the material interface between light reflective material 16 and encapsulating material 17.

Two factors strongly influence the location of the critical creepage path: differences in the coefficients of thermal expansion between light coupling material 14, light reflective material 16 and encapsulating material 17, and chemical interactions between these three materials. The differences in coefficients of thermal expansion ensures the critical creepage path occurs along the interface between light reflective material 16 and encapsulating material 17. As temperatures increase, light coupling material 14 and light reflective material 16 will expand at similar rates. Encapsulating material 17 will expand at a much slower rate thereby creating a creepage path along the interface between light reflective material 16 and encapsulating material 17.

Furthermore, since the major component of light reflective material 16 is light coupling material 14, the two components are readily miscible, wherein the bonds formed in this chemical interaction are predominantly covalent. On the other hand, there are not as many covalent bonds formed between light reflective material 16 and encapsulating material 17. Hence there is tighter coupling between light encapsulating material 14 and light reflective material 16 than between light reflective material 16 and encapsulating material 17; forcing the critical creepage path to occur along the interface between light reflective material 16 and encapsulating material 17. Thus both factors act together to facilitate the occurrence of the critical creepage path along the interface between light reflective material 16 and encapsulating material 17.

A cross-sectional side view of an alternate embodiment of the present invention is shown in FIG. 3. The structure in FIG. 3 comprises all the elements of the structure illustrated in FIG. 2, further including encasing first and second conductive interconnects 13A and 13B, respectively, within light reflective material 16. In addition, portions of light coupling material 14 on the top side of first conductor 12A, second conductor 12B, as well as portions of third conductor 18A and fourth conductor 18B are encased within light reflective material 16. Hence, in addition to the benefit of a higher breakdown voltage as described for FIG. 2, a decrease in damage to first and second conductive interconnects 13A and 13B, respectively, due to temperature cycling results.

Since the coefficient of thermal expansion of light coupling material 14 is different from that of encapsulating material 17 temperature cycling tends to stress, and in some instances break first and second conductive interconnects 13A and 13B, respectively. In the embodiment of FIG. 3, conductive interconnects 13A and 13B are encased within materials with similar coefficients of thermal expansion, thus stress due to temperature cycling is reduced thereby lowering the probability of damage to conductive interconnects 13A and 13B.

Figure 4:
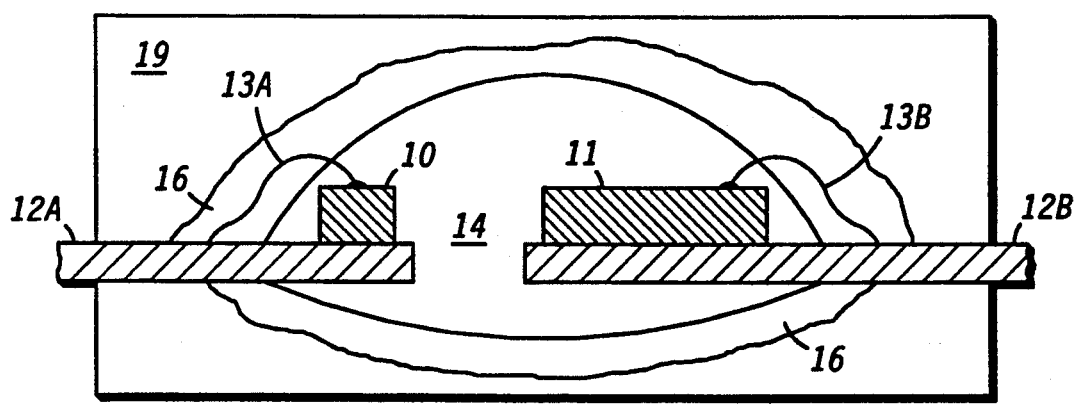
FIG. 4 is a cross-sectional side view showing yet another embodiment of the present invention.

A cross-sectional side view of a preferred embodiment of the present invention is shown in FIG. 4. The structure in FIG. 4 comprises all the elements of the structure illustrated in FIG. 3, further including encasing light coupling material 14 surrounding the top side of first and second conductors 12A and 12B, within light reflective material 16.

The benefits of higher breakdown voltage and stress relief during temperature cycling for conductive interconnects 13A and 13B are realized as explained for FIG. 2 and FIG. 3. In addition, complete encapsulation of light coupling material 14 within light reflective material 16 allows the added benefit of encasing the optocoupler apparatus within a nonreflective encapsulating material 19. Thus, a cost advantage is realized since an inexpensive mold compound may be used for encapsulation material 19 rather than mixing a mold compound with titanium dioxide; titanium dioxide being a relatively expensive compound. It is understood that even though titanium dioxide is relatively expensive, the small amount used in light reflective material 16 does not add disproportionately to the total cost. Further, since titanium dioxide is very damaging to mold assemblies, using an encapsulating material without this compound prolongs the life of mold assemblies. In a preferred embodiment, encapsulating material 19 is a carbon black silica based molding compound sold by Nitto as MP10TW.

Two performance indicators that serve as useful figures of merit for encased optocoupler devices are length of creepage path and breakdown voltage. For an encased optocoupler apparatus similar to those described by Adams et. al. the length of the creepage path is approximately 1378 millimeters. Further, for these devices 90% have a breakdown voltage of 4000 volts, however less than 2% have a breakdown voltage of 5000 volts.

The preferred embodiment of the invention shown in FIG. 4, on the other hand, has a creepage path of approximately 5512 millimeters; or approximately 4 times longer than for the devices described above. Further, greater than 99.6% of the devices produced as shown in FIG. 4 of the present embodiment have a breakdown voltage of 6300 volts. Hence, an increase in the creepage path correlates with an increase in the breakdown voltage.

By now it should be appreciated that there has been provided improved optocoupling devices having longer creepage paths and higher breakdown voltages. Moreover, coupling of light between a light emitting device and a light reflective device is enhanced by the judicious use of the highly light reflective material, titanium dioxide ($TiO_2$).

In addition, an embodiment has been described to improve the reliability of these types of devices by decreasing damage to conductive interconnects during temperature cycling. Finally, a preferred embodiment discloses a method which not only incorporates the benefits previously discussed but also lowers the cost of encapsulating material and prolongs the operating life of mold assemblies. This cost reduction is achieved by using an encapsulant that does not contain titanium dioxide.

I claim:

1. An optocoupler apparatus with reflective overcoat which comprises:
   a light emitting diode mounted on a first conductor;
   a detector device mounted on a second conductor wherein the first conductor is spaced from the second conductor;
   a first conductive interconnect that electrically connects the light emitting diode with a third conductor, wherein the third conductor is spaced from the first and second conductors;
   a second conductive interconnect that electrically connects the detector device with a fourth conductor, wherein the fourth conductor is spaced from the first, second, and third conductors;
   a light coupling material surrounding the light emitting diode, the detector device, portions of the first and second conductive interconnects, and portions of the first and second conductors, including a bottom side of the first and second conductors;
   a light reflective material coating a portion of the light coupling material that surrounds the bottom side of the first and second conductors; and
   an encapsulating material enclosing the light coupling material, the light reflective material, the first and second conductive interconnects, and portions of the first, second, third, and fourth conductors.

2. The optocoupler apparatus of claim 1 wherein the light reflective material is a mixture of the light coupling material and titanium dioxide, wherein the light coupling material is a clear silicone die coat.

3. The optocoupler apparatus of claim 1 wherein the light reflective material also coats the first and second conductive interconnects, a portion of the third and fourth conductors, and a portion of the light coupling material on the top side of the first and second conductors.

4. The optocoupler apparatus of claim 1 wherein the light reflective material coats the first and second conductive interconnects, the light coupling material, a portion of first and second conductors and a portion of the third and fourth conductors.

5. The optocoupler apparatus of claim 4 wherein the encapsulating material is a black opaque molding compound.

6. A method for encapsulating an optocoupling apparatus having an emitter device mounted to a first conductive support, a detector device mounted to a second conductive support, wherein the first and second conductive supports are spaced apart, a third conductor proximal to and spaced apart from the first conductive support, a fourth conductor proximal to and spaced apart from the second conductive support, a first interconnection electrically coupling the emitter device to the third conductor, and a second interconnection electrically coupling the detector device to the fourth conductor, which comprises:
   encasing the emitter device, the detector device, portions of the first and second conductive supports, a portion of the first interconnection and a portion of the second interconnection within a light coupling material;
   coating a portion of the light coupling material encasing the bottom sides of the first and second conductive supports with a light reflective material; and
   encasing the light coupling material, including the portion coated with light reflective material, the portions of the first and second interconnections not encased by light coupling material, and portions of the third and fourth conductors, within an encapsulating material.

7. The method of encapsulating the optocoupling apparatus of claim 6 further comprising mixing the light coupling material with titanium dioxide to form the light reflective material, wherein the light coupling material is electrically non-conductive and transparent to radiation in both the visible and nonvisible spectra.

8. The method of encapsulating the optocoupling apparatus of claim 6 further comprising mixing an epoxy and titanium dioxide to form the white opaque encapsulating material.

9. The method of encapsulating the optocoupling apparatus of claim 6 further comprising enclosing within the light reflective material the portions of the first and second interconnections not previously encased.

10. The method of encapsulating the optocoupling apparatus of claim 9 further comprising coating the uncoated portion of the light coupling material with light reflective material.

11. The method of encapsulating the optocoupling apparatus of claim 10 further comprising encasing the light reflective material, including components encased or coated by light reflective material, with a black opaque encapsulating material.

12. A method of enhancing coupling of light between a light emitter and a light detector housed in a same package, and both surrounded by a light coupling material which is encased in a white opaque encapsulating material, comprising the steps of:

forming the white opaque encapsulating material with a mixture of a black mold compound and titanium dioxide; and coating at least a portion of the light coupling material with a layer of light reflective material containing titanium dioxide.

* * * * *